United States Patent
Shimao et al.

(10) Patent No.: US 8,405,286 B2
(45) Date of Patent: Mar. 26, 2013

(54) MESA-TYPE AT-CUT QUARTZ-CRYSTAL VIBRATING PIECE AND THE QUARTZ-CRYSTAL DEVICE

(75) Inventors: Kenji Shimao, Sayama (JP); Manabu Ishikawa, Sayama (JP); Hiroyuki Sasaki, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 54 days.

(21) Appl. No.: 13/197,937

(22) Filed: Aug. 4, 2011

(65) Prior Publication Data

US 2012/0032563 A1 Feb. 9, 2012

(30) Foreign Application Priority Data

Aug. 7, 2010 (JP) ................................. 2010-178229

(51) Int. Cl.
*H01L 41/08* (2006.01)
(52) U.S. Cl. ..................... 310/361; 310/344; 310/368
(58) Field of Classification Search .................. 310/361, 310/367, 368
See application file for complete search history.

(56) References Cited

U.S. PATENT DOCUMENTS

| | | | | |
|---|---|---|---|---|
| 4,124,809 A | * | 11/1978 | Engdahl et al. | 310/361 |
| 7,608,986 B2 | * | 10/2009 | Yong et al. | 310/360 |
| 7,608,987 B2 | * | 10/2009 | Naito et al. | 310/361 |
| 7,861,389 B2 | * | 1/2011 | Naito et al. | 29/25.35 |
| 8,084,926 B2 | * | 12/2011 | Naito et al. | 310/361 |
| 2008/0036335 A1 | * | 2/2008 | Naito et al. | 310/361 |

FOREIGN PATENT DOCUMENTS

JP 2002-018698 A 1/2002

* cited by examiner

*Primary Examiner* — Mark Budd
(74) *Attorney, Agent, or Firm* — Alix, Yale & Ristas, LLP

(57) ABSTRACT

The present disclosure provides a mesa-type AT-cut quartz-crystal vibrating piece, in which amount of the vibrating unit is adjusted to appropriate amount, in order to inhibit unnecessary vibration and to prevent degradation. The mesa-type AT-cut quartz-crystal vibrating piece (30) for vibrating piece vibrates at 38.400 MHz comprises a rectangular excitation unit (31), a peripheral region (32) formed in periphery of the excitation unit and thinner than the excitation unit. The thickness difference h (μm) between one principal surface of the excitation unit and the adjacent peripheral region is obtained by the following equation: $h=(0.2 \times M_x)-143$ The length of the x-axis direction of the crystallographic X-axis is $M_x$ (μm).

10 Claims, 5 Drawing Sheets

100

100

100

(c)

MESA-TYPE AT-CUT QUARTZ-CRYSTAL VIBRATING PIECE AND THE QUARTZ-CRYSTAL DEVICE

CROSS-REFERENCE TO RELATED APPLICATION

This application claims priority to and the benefit of Japan Patent Application No. 2010-178229, filed on Aug. 7, 2010, in the Japan Patent Office, the disclosures of which are incorporated herein by reference in their respective entireties.

FIELD

The present disclosure pertains to the mesa-type AT-cut quartz-crystal vibrating piece and the quartz-crystal device comprising the same.

DESCRIPTION OF THE RELATED ART

One of the representative thickness-shear mode vibrating pieces is an AT-cut quartz-crystal vibrating piece. The quartz-crystal devices accommodating such AT-cut quartz-crystal device within their respective package are commonly used in different types of electric devices as a standard frequency sources. These quartz-crystal devices are being reduced in size, and recently developed AT-cut quartz-crystal vibrating pieces may include a curved, beveled, or convex, region at the outer periphery of the principal surface of the AT-cut quartz-crystal vibrating piece, in order to efficiently acquire energy trapping behavior. Curve processing, such as bevel or convex processing as disclosed in Japan Unexamined Patent Application No. 2002-018698, forms the sloped region on the outer periphery of the quartz-crystal vibrating piece by a barrel polishing method.

However, the AT-cut manufacturing method by wafer method has advanced in recent years, which made contouring more difficult. Therefore, mesa-type, processing is applied to the AT-cut quartz-crystal vibrating piece, in place of the contouring method, to reduce the thickness of the periphery of the quartz-crystal vibrating piece.

However, in the prior art mesa-type AT-cut quartz-crystal vibrating piece, the vibrating energy generated on the vibrating unit includes unnecessary vibrating energy generated on outer periphery of the vibrating unit which degrades the AT-cut quartz-crystal vibrating piece.

The present disclosure provides a mesa-type AT-cut quartz-crystal vibrating piece, in which the thickness of the peripheral region of the vibrating unit is adjusted to reduce unnecessary vibration and to prevent degradation.

SUMMARY

In its first aspect, the present disclosure provides a mesa-type AT-cut quartz-crystal vibrating piece vibrating at 38.400 MHz. The mesa-type AT-cut quartz-crystal vibrating piece comprises: a rectangular excitation unit surrounded by a peripheral region having a thickness less than the excitation unit. The term "thickness difference" as used in this disclosure refers to the thickness difference between the central excitation unit and the peripheral region surrounding the excitation unit. The thickness difference is evenly distributed with respect to the first (top) and second (bottom) principal surfaces of the quartz-crystal vibrating piece. A height h (μm) thickness difference between one principal surface of the excitation unit and the adjacent peripheral region is obtained by the following equation (1):

$$h = (0.2 \times Mx) - 143 \quad (1)$$

wherein the length of the rectangular excitation unit in x-axis direction of the crystallographic X-axis is denoted as Mx (μm).

In its second aspect, the present disclosure provides a mesa-type AT-cut quartz-crystal vibrating piece vibrating at 32.736 MHz. The mesa-type AT-cut quartz-crystal vibrating piece comprises: a rectangular excitation unit surrounded by a peripheral region having a thickness less than the excitation unit. A height h (μm) for the thickness difference between one principal surface of the excitation unit and the adjacent peripheral region is obtained by the following equation (2):

$$h = (0.1 \times Mx) - 87 \quad (2)$$

wherein the length of the rectangular excitation unit in x-axis direction of the crystallographic X-axis is denoted as Mx (μm).

In its third aspect, the present disclosure provides a mesa-type AT-cut quartz-crystal vibrating piece. The mesa-type AT-cut quartz-crystal vibrating piece comprises: a rectangular excitation unit surrounded by a peripheral region having a thickness less than the excitation unit. A height h (μm) for the thickness difference between one principal surface of the excitation unit and the adjacent peripheral region is obtained by the following equation (3):

$$h = (1.8 \times Mx/t^{0.7}) - 92 \quad (3)$$

wherein the length of the x-axis direction of the crystallographic X-axis is Mx (μm).

In its fourth aspect, the present disclosure provides a mesa-type AT-cut quartz-crystal vibrating piece. The mesa-type AT-cut quartz-crystal vibrating piece comprises an outer frame surrounding the peripheral region of the excitation unit and supporting the excitation unit at the peripheral region thereof.

In its fifth aspect, the present disclosure provides a quartz-crystal device. The quartz-crystal device comprises a mesa-type AT-cut quartz-crystal vibrating piece in any one of the first to third aspects; a base having a recess for containing the mesa-type AT-cut quartz-crystal vibrating piece; and a lid for sealing the recess.

In its sixth aspect, the present disclosure provides a quartz-crystal device. The quartz-crystal device, comprises the mesa-type AT-cut quartz-crystal vibrating piece of the fourth aspect having a first (top) principal surface and a second (bottom) principal surface; the lid having a first surface to be bonded onto the first (top) principal surface of the outer frame; and the base having a second surface to be bonded onto the second (bottom) principal surface of the outer frame.

The present disclosure provides a mesa-type AT-cut quartz-crystal vibrating piece, in which the thickness of the peripheral region of the vibrating unit is reduced in order to inhibit unnecessary vibration and to prevent degradation of the AT-cut quartz-crystal vibrating piece.

DETAILED DESCRIPTION

Various representative embodiments are described below with reference to the respective drawings. It will be understood that the scope of the disclosure is not limited to the described embodiments, unless otherwise stated.

First Embodiment
<Overall Configuration of Quartz-Crystal Device 100>

Figure 1A:
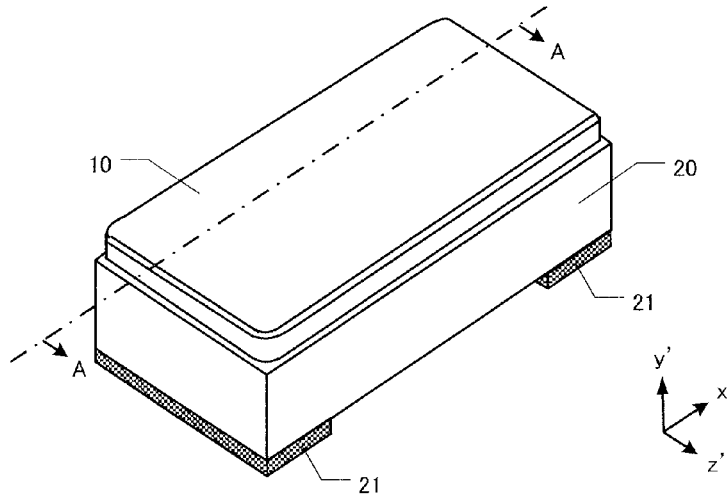
FIG. 1A is a perspective view of the quartz-crystal device 100.

FIG. 1A is a perspective view of the quartz-crystal device 100. The quartz-crystal device 100 is constituted of the lid 10, base 20 and AT-cut quartz-crystal vibrating piece 30 (refer to FIG. 1B) mounted in the base 20. The AT-cut quartz-crystal vibrating piece has a principal plane (YZ plane) that is inclined, with respect to the Y-axis of the crystal axes (XYZ), from the Z-axis to the Y-axis direction by 35°15'. Therefore, the quartz-crystal device 100 is described below by designating a longitudinal direction thereof as the X-axis direction, designating the thickness direction thereof as the Y'-axis direction, and designating the width direction thereof that is perpendicular to the X-axis and Y'-axis directions as the Z'-axis direction. In this explanation below, inclination to the Y'-axis is denoted as +Y'-axis and declination to the Y'-axis is denoted as −Y'-axis.

A cavity 24 is formed inner side of the base 20 (refer to FIG. 1B), and an AT-cut quartz-crystal vibrating piece 30 is situated onto the cavity 24. The external electrodes 21 are formed on lower main surface of the base 20. The lid 10 is disposed on +Y'-axis direction to the base 20, so as to seal the cavity 24. The lid 10 is fabricated by materials such as ceramic, glass, quartz-crystal and metal. The base 20 is fabricated by materials such as ceramic, glass and quartz-crystal.

Figure 1B:
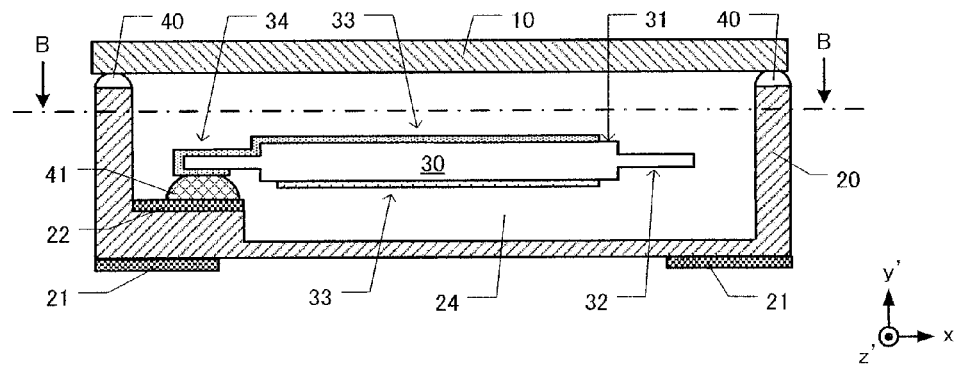
FIG. 1B is a cross-sectional view of the quartz-crystal device 100.

FIG. 1B is a cross-section of the quartz-crystal device 100. FIG. 1B is a cross-section of the FIG. 1A taken along A-A line or the FIG. 1C along C-C line, which will be explained hereafter. The recess on the base 20 forms the cavity 24. The connection electrodes 22 are formed on lower side of the cavity 24, and the connection electrodes 22 are electrically connected to the external electrodes 21 via conductor (not shown). An excitation unit 31 is formed on the AT-cut quartz-crystal vibrating piece 30, and a peripheral region 32 is disposed on outer periphery of the excitation unit 31. The thickness of the peripheral region 32 is less than the thickness of the excitation unit 31. The excitation electrodes 33 are formed on both the first (upper) principal surface and the second (lower) principal surface of the excitation unit 31. The extraction electrodes 34 are formed on the peripheral region 32, and the extraction electrodes 34 are electrically connected to the excitation electrodes 33. The excitation electrodes 33 and the extraction electrodes 34 comprise a chrome (Cr) layer on surfaces of the quartz-crystal and a gold (Au) layer overlays the surface of the chrome (Cr) layer. The extraction electrodes are electrically connected to respective connection electrodes 22 via electrically conductive adhesive 41. Thereby, the excitation electrodes 33 are electrically connected to respective external electrodes 21.

Figure 1C:
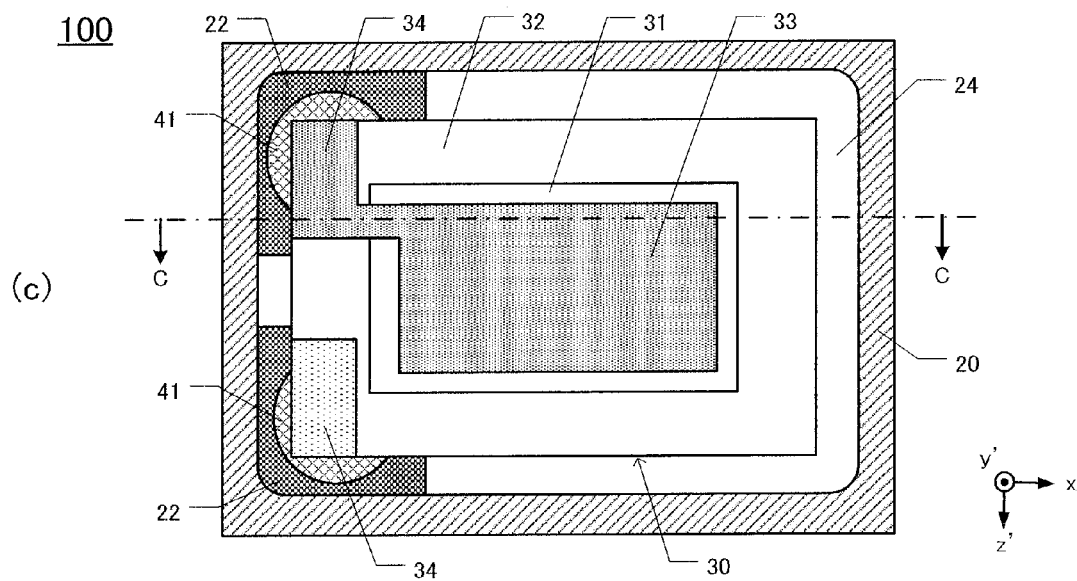
FIG. 1C is a cross-sectional view of the quartz-crystal device 100 taken along B-B line.

FIG. 1C is a cross-section of the FIG. 1B along B-B line. On the cavity 24 disposed on the base 20, two connection electrodes 22 are formed. One connection electrode 22 is electrically connected to the excitation electrode 33 situated on upper surface of the excitation unit 31 of the AT-cut quartz-crystal vibrating piece 30, and the other connection electrode 22 is electrically connected to the excitation electrode 33 situated on lower surface of the excitation unit 31.

Figure 2A:
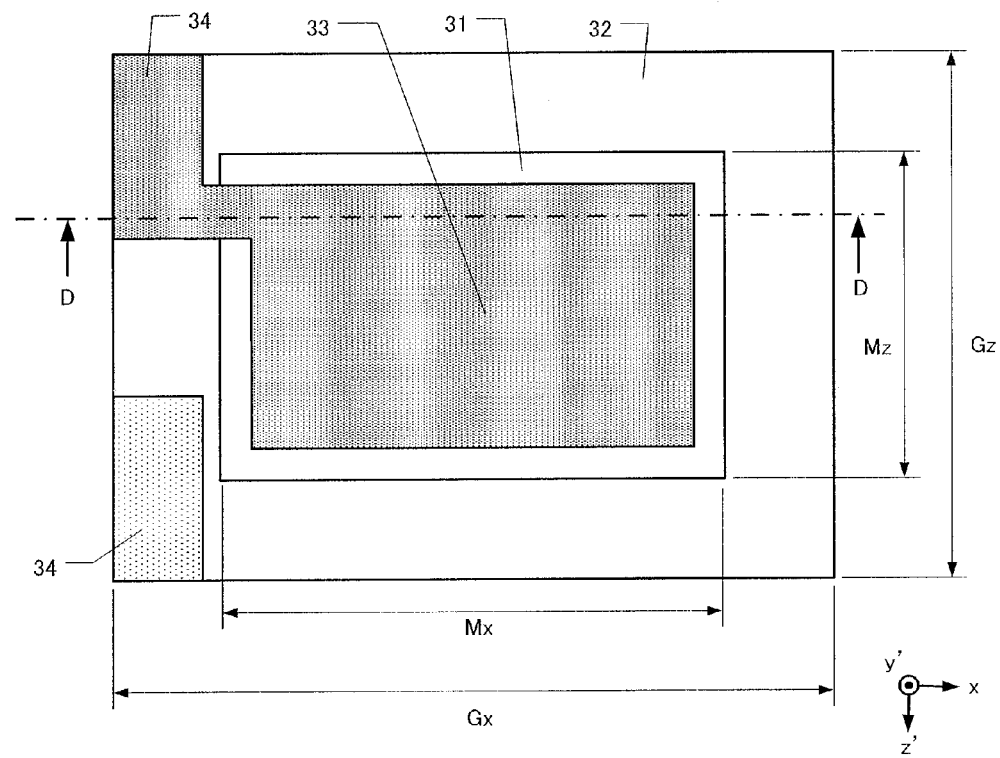
FIG. 2A is a plan view of the AT-cut quartz-crystal vibrating piece 30.

FIG. 2A is a plan view of the AT-cut quartz-crystal vibrating piece 30. The AT-cut quartz-crystal vibrating piece 30 has same respective X-axis direction as the crystallographic X-axis of the quartz-crystal. Also, Z'-axis direction of the AT-cut quartz-crystal vibrating piece 30 has same respective axial direction as direction of the quartz-crystal from the Z-axis to the Y-axis direction tilted by 35°15'. Length Gx of the AT-cut quartz-crystal vibrating piece 30 in X-axis direction is, for example, 990 μm, and width Gz of the AT-cut quartz-crystal vibrating piece 30 in Z'-axis direction is, for example, 700 μm. Also, length of the excitation unit 31 in the X-axis direction is denoted as Mx and the width in the Z'-axis direction is denoted as Mz.

Figure 2B:
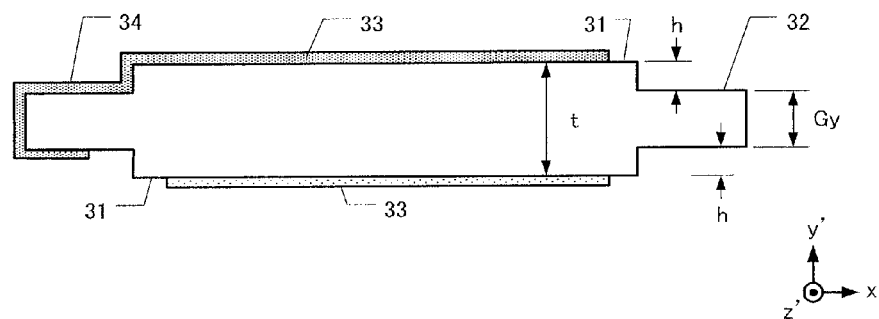
FIG. 2B is a cross-sectional view of FIG. 2A taken along D-D line.

FIG. 2B is a cross-section of FIG. 2A, taken along D-D line. The thickness of the peripheral region 32 of the AT-cut quartz-crystal vibrating piece 30 is denoted as Gy, thickness of the excitation unit 31 is denoted as t, and the thickness difference between the excitation unit 31 and the peripheral region 32 is denoted as h. In the disclosed embodiments, the thickness difference between the thickness t of the excitation unit 31 and the thickness Gy of the peripheral region 32 is evenly distributed with respect to the first (top) and second (bottom) principal surfaces of the excitation unit 31. Reference letter h is used to designate the height of an elevational step between one principal surface (top or bottom) of the excitation unit 31 and the peripheral region 32. As is shown in FIG. 2B, the total thickness difference between the thickness t of the excitation unit 31 and the thickness Gy of the peripheral region 32 is actually 2×h. A thickness difference between the excitation unit 31 and peripheral region 32 are formed on both +Y'-axis and −Y'-axis sides of the AT-cut quartz-crystal vibrating piece 30, and both thickness differences are leveled at same height. The thickness difference h is positive, and the thickness t of the excitation unit 31 is greater than the thickness Gy of the peripheral region 32.

<Thickness Difference h>

By performing an experiment for determining the optimum length of the AT-cut quartz-crystal vibrating piece 30, it was found that the thickness difference h correlates to the length Mx of the excitation unit 31 in X-axis direction and the vibrating frequency. Also, it was found that the thickness difference h correlates to the length Mx of the excitation unit 31 in x-axis direction and thickness t of the excitation unit 31. Hereinafter, the above-identified correlations are explained.

Figure 3A:
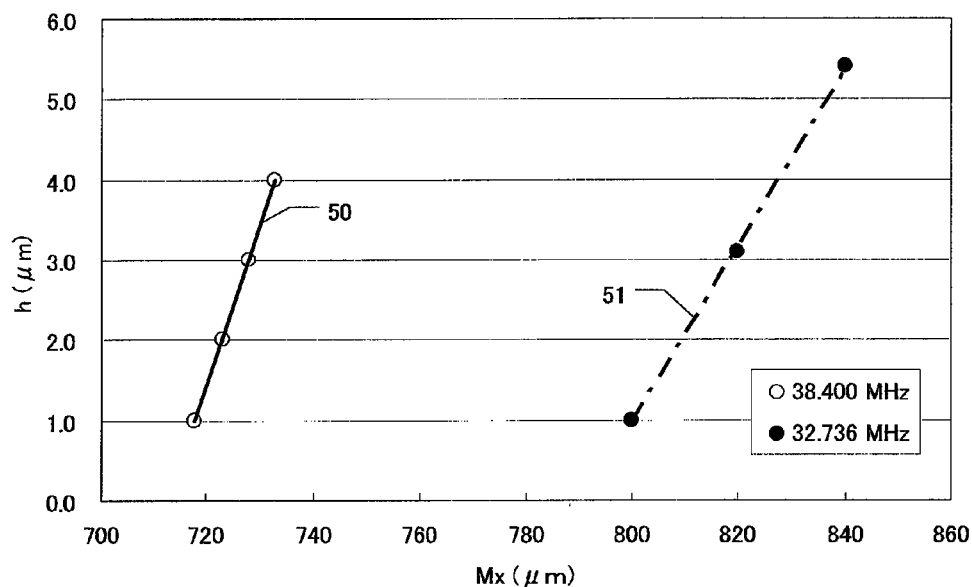
FIG. 3A is a graph showing the correlation between the thickness difference h at specific vibrating frequency and the length Mx of the excitation unit 31 in X-axis direction.

FIG. 3A is a graph showing a correlation between the thickness difference h and length Mx of the excitation unit 31 in X-axis direction at predetermined vibrating frequency. The abscissa of the graph indicates the length Mx (μm) of the excitation unit 31 in X-axis direction, and the ordinate indicates the height (μm) of the elevational section. The white circle in FIG. 3A indicates the value at vibrating frequency of 38.400 MHz, and the black circle indicates the value at vibrating frequency of 32.736 MHz. The inventor of the present disclosure manufactured forty AT-cut quartz-crystal vibrating piece 30 at thickness difference of h=1 μm and vibrating frequency of 38.400, each quartz-crystal vibrating piece having different length Mx. Similarly with other thickness differences, forty AT-cut quartz-crystal vibrating pieces 30 were manufactured having different lengths Mx. Then, the inventor of present disclosure measured CI (crystal impedance) value of each AT-cut quartz-crystal vibrating piece 30. Each of the forty AT-cut quartz-crystal vibrating pieces 30 had different CI value, and the CI value had quadric curve (parabola) relation to the length Mx. Each white circle and black circle indicated in FIG. 3 is inputted with the length Mx which produces the lowest CI value at respective vibrating frequency and thickness difference h.

In FIG. 3A, for both 32.736 MHz and 38.400 MHz, the thickness difference h increased as the length Mx of the excitation unit 31 in the X-axis direction extends longer. Also, the amount of each vibrating frequency of FIG. 3A is aligned in a straight line. In FIG. 3A, the solid straight line 50 denotes the 38.400 MHz and dotted-dash line denotes the 32.736 MHz. The solid straight line 50 can be calculated by the following equation:

$$h = (0.2 \times Mx) - 143 \tag{1}$$

Also, the dotted-dash line 51 can be calculated by the following equation:

$$h = (0.1 \times Mx) - 87 \tag{2}$$

Figure 3B:
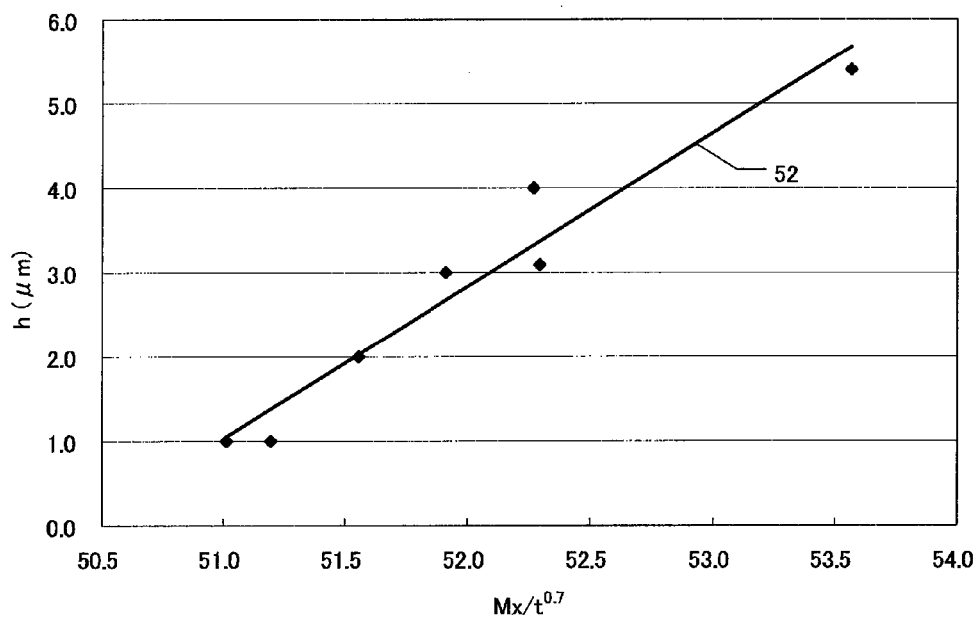
FIG. 3B is a graph showing the correlation between the thickness difference h, length Mx of the excitation unit 31 in X-axis direction and thickness t of the excitation unit 31.

FIG. 3B is a graph showing the correlation between the thickness difference h, length Mx of the excitation unit 31 in X-axis direction and thickness t of the excitation unit 31.

The abscissa of the FIG. 3B indicates $Mx/t^{0.7}$, and the ordinate indicates the thickness difference h (μm). In FIG. 3B, the relationship between the thickness difference h at the vibrating frequency of 32.736 MHz and 38.400 MHz and at $Mx/t^{0.7}$ wherein the CI value becomes the lowest, is indicated in black dot. The measurement was taken with the thickness t of the vibrating frequency 31 being 51.0 μm at the vibrating frequency of 32.736 MHz, and 43.5 μm at the vibrating frequency of 38.400 MHz. The black dots indicated in FIG. 3B were mostly on the solid line 52 or on neighborhood of the solid line 52, and the position of the black dots can be approximated by the solid line 52. The solid line 52 can be calculated using the following equation:

$$h = (1.8 \times Mx/t^{0.7}) - 92 \tag{3}$$

The equation (1) and equation (2) can determine the thickness difference h for excitation unit 31 for lowering the CI value, when manufacturing the AT-cut quartz-crystal vibrating piece 30 having the vibrating frequency of either 38.400 MHz or 32.736 MHz, and the value of the excitation unit 31 on the mesa portion is predetermined. Also, the equation (3) allows calculating the thickness difference h of the excitation unit 31 for lowering the CI value by using the thickness t of the excitation unit 31 and the length Mx of the excitation unit 31, regardless of the vibrating frequency.

Second Embodiment

The AT-cut quartz-crystal frame may be surrounded by the outer frame. An explanation regarding the AT-cut quartz-crystal vibrating piece having surrounded by the outer frame is explained hereafter.

<Configuration of the Quartz-Crystal Device 200>

Figure 4A:
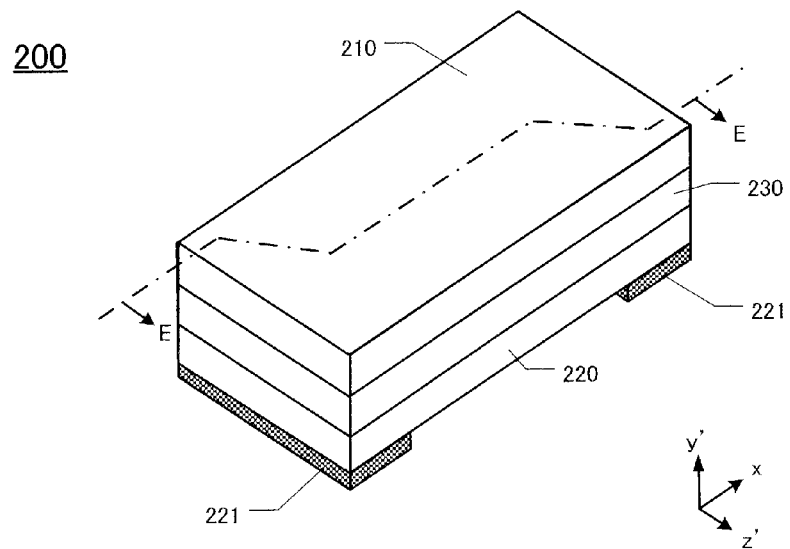
FIG. 4A is a perspective view of the quartz-crystal device 200.

FIG. 4A is an exploded view of the quartz-crystal device 200. The quartz-crystal device 200 includes the lid 210, AT-cut quartz-crystal vibrating piece 230 and the base 220. The lid 210 is disposed on upper side of the quartz-crystal device 200, the base 220 is disposed on lower side, and the quartz-crystal vibrating piece 230 is sandwiched between the lid 210 and base 220. The external electrodes 221 are disposed on the lower main surface of the base 220. Lid 210 and base 220 are fabricated of glass or quartz-crystal material.

Figure 4B:
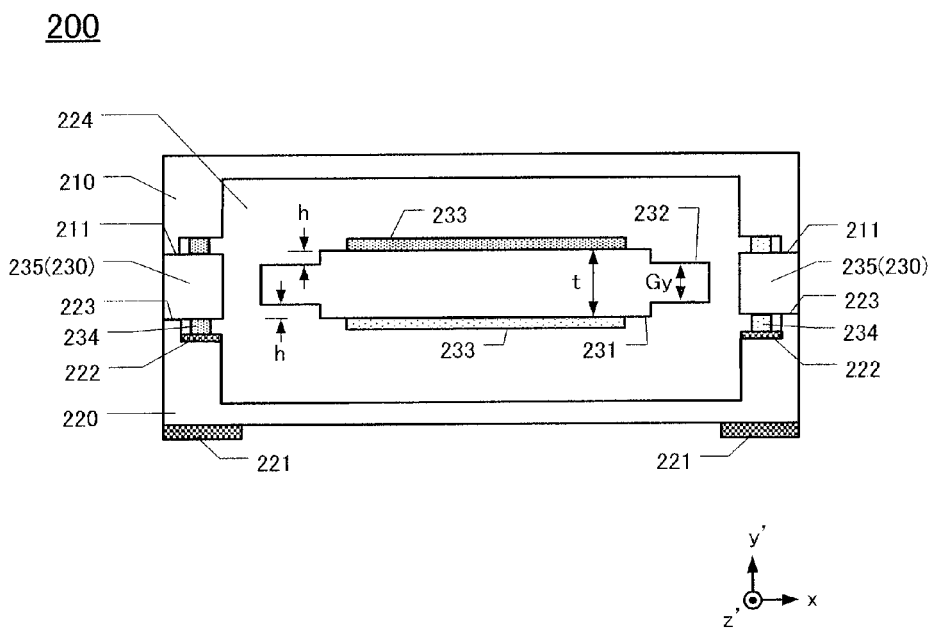
FIG. 4B is a cross-sectional view of the FIG. 4A taken along E-E line.

FIG. 4B is a cross-section of FIG. 4A along E-E line. On the AT-cut quartz-crystal vibrating piece 230, an excitation unit 231 and a peripheral region 232 are formed, and the outer frame 235 is formed surrounding the peripheral region 232. The outer frame 235 is situated to support the peripheral region 232. The excitation electrodes 233 are formed on both the first (upper) principal surface and the second (lower) principal surface of the excitation unit 231, and the extraction electrodes 234 are formed on the outer frame 235 and extend to the peripheral region 232. The AT-cut vibrating piece 230 vibrates at predetermined vibration per minute, when voltage is applied from a pair of the excitation electrodes 233. The lid 210 is bonded by contacting the principal surface of the outer frame 235 and the first surface 211 on the −Y'-axis side of the lid 210, and the base 220 is bonded by contacting the other principal surface of the base 220 and the second surface 223 on the +Y'-axis side. The connection electrodes 222 are formed on the base 220 on the +Y'-axis side, and when bonding the connection electrodes 222 and AT-cut quartz-crystal vibrating piece 230, the connection electrodes 222 are bonded to the extraction electrodes 234. Also, the connection electrodes 222 are electrically connected to the external electrodes 221 via conductor (not shown).

The thickness of the excitation unit 231 of the AT-cut quartz-crystal vibrating piece 230 is designated by t, and the thickness of the peripheral region 232 is designated by Gy. The elevated section of the excitation unit 231 and the peripheral region 232 indicates the leveled surface formed on the +Y'-axis side and −Y'-axis side, which is designated by h. Further, the AT-cut quartz-crystal vibrating piece 230 is fabricated of synthetic quartz-crystal, has same respective X-axis direction as the crystallographic X-axis of the quartz-crystal, and has same respective axial direction as the direction of the quartz-crystal from the Z-axis to the Y-axis direction tilted by 35°15', which is similar feature as the AT-cut quartz-crystal vibrating piece 30.

Figure 5A:
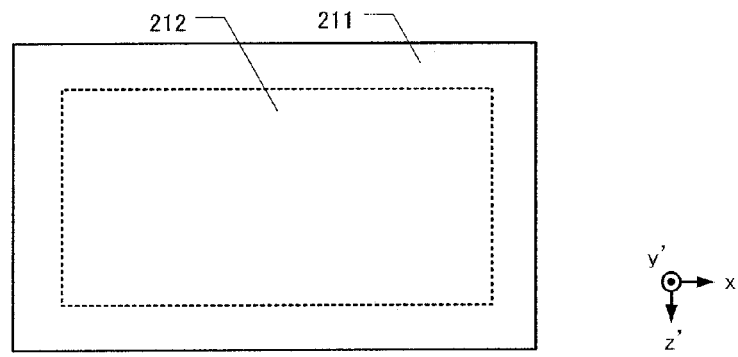
FIG. 5A is a plan view of the lid 210.

FIG. 5A is a plan view of the lid 210. The lid 210 has a rectangular principal surface having a longitudinal axis in the X-axis direction and a short axis in the Z'-axis direction. On peripheral unit on the surface on −Y'-axis side, a first surface 211 is formed, which is connected to the outer frame 235 of the AT-cut quartz-crystal vibrating piece 230, and a recess 212 is formed on center, surrounded by the first surface 211.

Figure 5B:
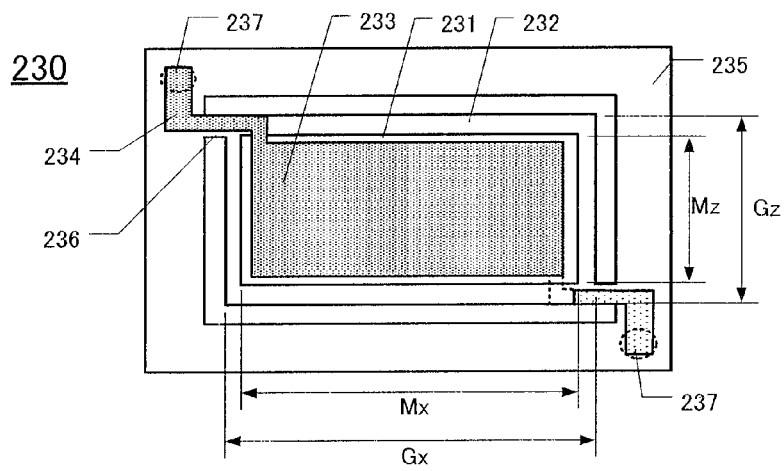
FIG. 5B is a plan view of the AT-cut quartz-crystal vibrating piece 230.

FIG. 5B is a plan view of the AT-cut quartz-crystal vibrating piece 230. The AT-cut quartz-crystal vibrating piece 230 and the outer frame 235 are connected by the connecting arms 236. The extraction electrodes 234 extracted from the excitation electrodes 233 on the excitation unit 231 is formed through the peripheral region 232 and connecting arms 236 to corners of the outer frame 235. The extraction electrodes 234 are connected to the connection electrodes 222, formed on the base 220, at connection points 237 on corners of the outer frame 235. Connection points 237 are formed on corners of the outer frame 235, indicated with dotted oval circle in FIG. 5B. Length Gx of the peripheral region 232 on the AT-cut quartz-crystal vibrating piece 230 in X-axis direction is, for example, 990 μm, and width Gz of the peripheral region 232 on the AT-cut quartz-crystal vibrating piece 230 in Z'-axis direction is, for example, 700 μm. Also, length of the excitation unit 31 in X-axis direction is denoted as Mx and the width in the Z'-axis direction is denoted as Mz.

Figure 5C:
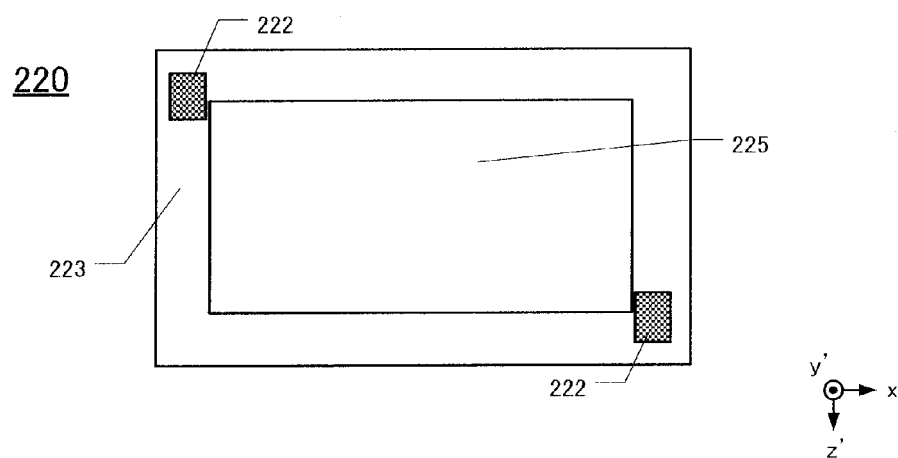
FIG. 5C is a plan view of the base 220.

FIG. 5C is a plan view of the base 220. The second surface 223 is formed on outer periphery of the base 220 in +Y'-axis side surface, which is bonded to the outer frame 235 of the AT-cut quartz-crystal vibrating piece 230, and a recess 225 is formed inside of the second surface 223. On part of the second surface 223 in +Y'-axis side of the base 220, the connection electrodes 222 are formed, which is electrically connected to the connection point 237 of the extraction electrodes 234 on the AT-cut quartz-crystal vibrating piece 230.

Although the outer frame is situated on the AT-cut quartz-crystal vibrating piece, since the peripheral region and the outer frame are connected by the connecting arms, excitation energy for unnecessary vibration, generated on the peripheral region, do not change largely. Therefore, the equation (1), equation (2) and equation (3) can be applied to the AT-cut quartz-crystal vibrating piece.

As mentioned above, although optimal embodiments of the present disclosure were explained in detail, it will be understood by a person skilled in the art that the disclosure encompasses various alterations and modifications to the embodiments, within the technical scope of the invention.

What is claimed is:

1. A mesa-type AT-cut quartz-crystal vibrating piece for vibrating at 38.400 MHz, comprising:
    a rectangular excitation unit having a first thickness between first and second principal surfaces and a peripheral region having a second thickness less than said first thickness formed on the periphery of the excitation unit, wherein
    a height h (μm) for the thickness difference between one principal surface of the excitation unit and the adjacent peripheral region is obtained by the following equation (1):

$$h=(0.2 \times Mx)-143 \tag{1}$$

wherein the length of the rectangular excitation unit in x-axis direction of the crystallographic X-axis is denoted as Mx (μm).

2. A mesa-type AT-cut quartz-crystal vibrating piece for vibrating piece vibrates at 32.736 MHz, comprising:
    a rectangular excitation unit having a first thickness between first and second principal surfaces and a peripheral region having a second thickness less than said first thickness formed on the periphery of the excitation unit, wherein
    a height h (μm) for the thickness difference between one principal surface of the excitation unit and the adjacent peripheral region is obtained by the following equation (2):

$$h=(0.1 \times Mx)-87 \tag{2}$$

wherein the length of the rectangular excitation unit in x-axis direction of the crystallographic X-axis is denoted as Mx (μm).

3. A mesa-type AT-cut quartz-crystal vibrating piece, comprising:
    a rectangular excitation unit having a first thickness between first and second principal surfaces and a peripheral region having a second thickness less than said first thickness formed on the periphery of the excitation unit; wherein
    a height h (μm) for the thickness difference between one principal surface of the excitation unit and the adjacent peripheral region is obtained by the following equation (3):

$$h=(1.8 \times Mx/t^{0.7})-92 \tag{3}$$

wherein the thickness of the excitation unit is denoted as t (μm) and the length of the rectangular excitation unit in x-axis direction of the crystallographic X-axis is denoted as Mx (μm).

4. The mesa-type AT-cut quartz-crystal vibrating piece of claim 1, comprising an outer frame for surrounding the peripheral region and supporting the peripheral region thereof.

5. The mesa-type AT-cut quartz-crystal vibrating piece of claim 2, comprising an outer frame for surrounding the peripheral region and supporting the peripheral region thereof.

6. The mesa-type AT-cut quartz-crystal vibrating piece of claim 3, comprising an outer frame for surrounding the peripheral region and supporting the peripheral region thereof.

7. The mesa-type AT-cut quartz-crystal vibrating piece of claim 1, in combination with:
    a base having a recess for containing the mesa-type AT-cut quartz-crystal vibrating piece; and
    a lid for sealing the recess,
    wherein said vibrating piece, base and lid comprise a quartz-crystal device.

8. The mesa-type AT-cut quartz crystal vibrating piece of claim 2, in combination with:
    a base having a recess for containing the mesa-type AT-cut quartz-crystal vibrating piece; and
    a lid for sealing the recess,
    wherein said vibrating piece, base and lid comprise a quartz-crystal device.

9. The mesa-type AT-cut quartz-crystal vibrating piece of claim 3 in combination with:
    a base having a recess for containing the mesa-type AT-cut quartz-crystal vibrating piece; and
    a lid for sealing the recess,
    wherein said vibrating piece, base and lid comprise a quartz-crystal device.

10. The mesa-type AT-cut quartz-crystal vibrating piece of claim 4, comprising:
    said vibrating piece outer frame having a first principal surface and a second principal surface;
    a lid having a first surface to be bonded onto the first principal surface of the outer frame; and
    a base having a second surface to be bonded onto the second principal surface of the outer frame,
    wherein said vibrating piece, lid and base comprise a quartz-crystal vibrating device.

* * * * *